(12) United States Patent
Watanabe

(10) Patent No.: US 11,302,843 B2
(45) Date of Patent: Apr. 12, 2022

(54) DEEP ULTRAVIOLET LIGHT-EMITTING DEVICE AND METHOD OF MANUFACTURING SAME

(71) Applicant: DOWA Electronics Materials Co., Ltd., Tokyo (JP)

(72) Inventor: Yasuhiro Watanabe, Akita (JP)

(73) Assignee: DOWA Electronics Materials Co., Ltd., Tokyo (JP)

( * ) Notice: Subject to any disclaimer, the term of this patent is extended or adjusted under 35 U.S.C. 154(b) by 119 days.

(21) Appl. No.: 16/651,352

(22) PCT Filed: Sep. 28, 2018

(86) PCT No.: PCT/JP2018/036549
§ 371 (c)(1),
(2) Date: Mar. 27, 2020

(87) PCT Pub. No.: WO2019/069834
PCT Pub. Date: Apr. 11, 2019

(65) Prior Publication Data
US 2020/0235260 A1 Jul. 23, 2020

(30) Foreign Application Priority Data
Oct. 2, 2017 (JP) .............................. JP2017-192984

(51) Int. Cl.
*H01L 33/06* (2010.01)
*H01L 33/32* (2010.01)
(Continued)

(52) U.S. Cl.
CPC .......... *H01L 33/06* (2013.01); *H01L 33/0075* (2013.01); *H01L 33/08* (2013.01); *H01L 33/145* (2013.01); *H01L 33/325* (2013.01)

(58) Field of Classification Search
CPC combination set(s) only.
See application file for complete search history.

(56) References Cited

U.S. PATENT DOCUMENTS 6,649,942 B2 * 11/2003 Hata ..................... H01L 33/007
257/103
2003/0127658 A1 7/2003 Sheu et al.
(Continued)

FOREIGN PATENT DOCUMENTS

JP 2002280610 A 9/2002
JP 2011049322 A 3/2011
(Continued)

OTHER PUBLICATIONS

Apr. 8, 2020, International Preliminary Report on Patentability issued in the International Patent Application No. PCT/JP2018/036549.

(Continued)

*Primary Examiner* — Savitri Mulpuri
(74) *Attorney, Agent, or Firm* — Kenja IP Law PC

(57) ABSTRACT

Disclosed is a deep ultraviolet light-emitting device which includes on a substrate 10 in order: an n-type semiconductor layer 30, a light-emitting layer 40, a p-type electron block layer 60, and a p-type contact layer 70, wherein the p-type contact layer 70 comprises a superlattice structure having an alternating stack of: a first layer 71 made of $Al_xGa_{1-x}N$ having an Al composition ratio x higher than an Al composition ratio $w_0$ of a layer configured to emit deep ultraviolet light in the light-emitting layer; and a second layer 72 made of $Al_yGa_{1-y}N$ having an Al composition ratio y lower than the Al composition ratio x, and the Al composition ratio $w_0$, the Al composition ratio x, the Al composition ratio y, and a thickness average Al composition ratio z of the p-type contact layer satisfy the formula [1] $0.030 < z-w_0 < 0.20$ and the formula [2] $0.050 \leq x-y \leq 0.47$.

10 Claims, 2 Drawing Sheets

(51) Int. Cl.
  *H01L 33/00* (2010.01)
  *H01L 33/14* (2010.01)
  *H01L 33/08* (2010.01)

(56) References Cited

U.S. PATENT DOCUMENTS

| | | | |
|---|---|---|---|
| 2007/0108457 A1* | 5/2007 | Lai | H01L 33/14 257/94 |
| 2010/0051965 A1* | 3/2010 | Yu | H01L 33/007 257/79 |
| 2014/0209862 A1* | 7/2014 | Ikuta | H01L 29/7787 257/22 |
| 2016/0268477 A1* | 9/2016 | Fujita | H01L 33/007 |
| 2017/0309785 A1* | 10/2017 | Watanabe | H01L 33/0075 |
| 2017/0338378 A1* | 11/2017 | Fujita | H01L 33/32 |
| 2018/0019375 A1* | 1/2018 | Fujita | H01L 33/32 |
| 2018/0166604 A1* | 6/2018 | Fujita | H01L 21/02579 |
| 2019/0006558 A1* | 1/2019 | Watanabe | H01L 33/36 |
| 2020/0287087 A1* | 9/2020 | Watanabe | H01L 33/32 |

FOREIGN PATENT DOCUMENTS

| | | |
|---|---|---|
| JP | 2011066047 A | 3/2011 |
| JP | 2015216352 A | 12/2015 |
| WO | 2017017891 A1 | 2/2017 |
| WO | 2017134713 A1 | 8/2017 |

OTHER PUBLICATIONS

Apr. 15, 2020, Office Action issued by the Taiwan Intellectual Property Office in the corresponding Taiwanese Patent Application No. 107134836.

Sep. 30, 2020, Office Action issued by the Taiwan Intellectual Property Office in the corresponding Taiwanese Patent Application No. 107134836.

Dec. 11, 2018, International Search Report issued in the International Patent Application No. PCT/JP2018/036549.

* cited by examiner

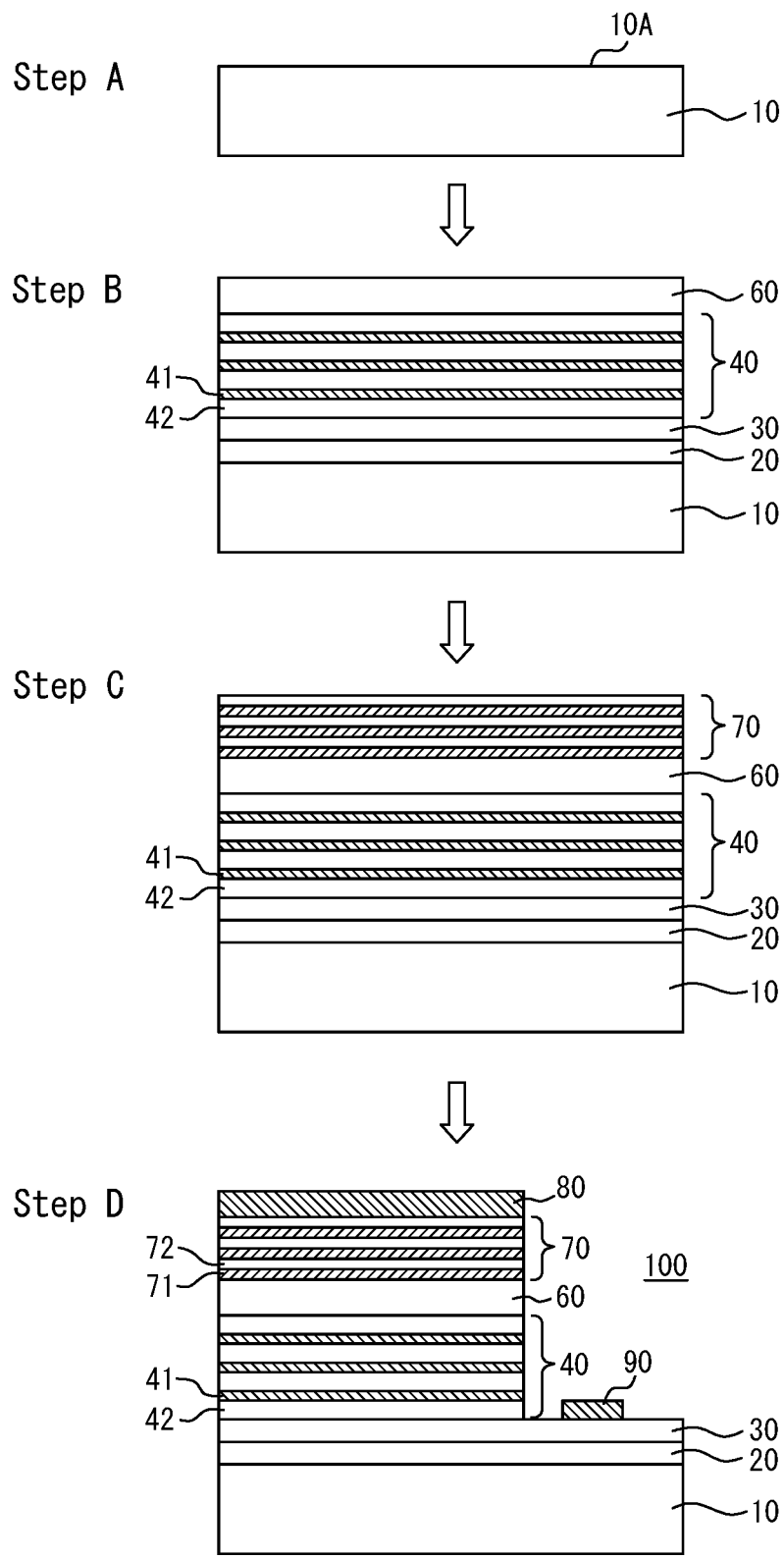

DEEP ULTRAVIOLET LIGHT-EMITTING DEVICE AND METHOD OF MANUFACTURING SAME

TECHNICAL FIELD

The present disclosure relates to a deep ultraviolet light-emitting device and a method of manufacturing the same and, in particular, to a deep ultraviolet light-emitting device having both high power output and excellent reliability, and a method of manufacturing the same.

BACKGROUND

Group III nitride semiconductors formed of a compound of Al, Ga In or other element and N are wide band-gap semiconductors with direct transition type band structure, and are expected to have wide application fields such as disinfecting, clean water, medical, lighting, and high-density optical recording. In particular, light-emitting devices which use Group III nitride semiconductors in their light-emitting layer can cover from deep ultraviolet light to visible light regions by adjusting the Group III element content and have been studied for their practical application to various light sources.

Light with a wavelength of 200 nm to 350 nm is called deep ultraviolet light. Deep ultraviolet light-emitting devices configured to emit deep ultraviolet light are generally fabricated as follows: A buffer layer is first formed on a substrate made of, for example, sapphire or MN single crystal. An n-type semiconductor layer made of Group III nitride semiconductor, a light-emitting layer, and a p-type semiconductor layer are then sequentially formed. Finally, an n-side electrode which is electrically connected to the n-type semiconductor layer, and a p-side electrode which is electrically connected to the p-type semiconductor layer are formed. It has been common to form a p-type GaN contact layer on the p-side electrode side of the p-type semiconductor layer so as to increase the hole concentration in order to make ohmic contact. Note that a multiple quantum well (MQW) structure in which barrier layers and well layers made of Group III nitride semiconductor are alternately stacked is widely used for the light-emitting layer.

One of the characteristics required for deep ultraviolet light-emitting devices is high external quantum efficiency characteristic. External quantum efficiency is determined by: (i) internal quantum efficiency, (ii) electron inflow efficiency, and (iii) out-coupling efficiency.

PTL 1 discloses a deep ultraviolet light-emitting diode which comprises a p-type contact layer of AlGaN mixed crystal, and a p-side reflective electrode which exhibits reflectivity with respect to light emitted from the light-emitting layer, wherein the substrate side is configured as the out-coupling direction. For short wavelengths of light, the higher the Al-composition ratio of the p-type contact layer made of AlGaN, the higher transmittance of the p-type contact layer can be. Hence, PTL 1 proposes using a p-type contact layer made of AlGaN having a transmittance corresponding to the emission wavelength, instead of a p-type contact layer made of GaN which was conventionally common. According to PTL 1, even if the hole concentration is reduced compared with GaN, the use of a p-type contact layer made of AlGaN allows the p-type contact layer to have increased transmittance for emission light to provide a greatly improved out-coupling efficiency, thereby improving overall external quantum efficiency.

CITATION LIST

Patent Literature

PTL 1: JP2015-216352A

SUMMARY

Technical Problem

PTL 1 claims that it is more preferred that the p-type contact layer has higher transmission for emission light. Therefore, according to PTL 1, it is more preferred that the Al-composition ratio of the p-type contact layer is higher.

However, according to experiments conducted by the inventors, it has been established that simply increasing the transmittance of the emitted deep ultraviolet light with respect to the central emission wavelength by simply increasing the Al composition ratio of the p-type contact layer in contact with the p-side electrode is not suitable for practical use for the reason described below. First, it is indeed possible to obtain a deep ultraviolet light-emitting device having a higher power output than the conventional ones by increasing the transmittance for deep ultraviolet light in the p-type contact layer. However, when an overload reliability test (specifically, turning on power at 100 mA for 3 seconds) was performed on samples of the deep ultraviolet light-emitting device thus manufactured, the inventors confirmed a phenomenon wherein some of the samples showed a sudden decrease in the power emission to a level that is even half the initial power output or the device becomes unlit suddenly (hereinafter, also referred to as "sudden death"). Devices which show such a sudden power output deterioration are less reliable, and unwanted incorporation of less reliable devices into a product is unacceptable from the viewpoint of product quality control.

Accordingly, the present disclosure aims to provide a deep ultraviolet light-emitting device having both high power output and excellent reliability, and a method of manufacturing the same.

Solution to Problem

As a result of intensive studies to solve the above problem, the inventors focused on using a p-type contact layer having a superlattice structure. Furthermore, they found that high power output and excellent reliability can be achieved by optimizing the Al composition ratio of the superlattice structure and thus completed the present disclosure. Specifically, the features of the present disclosure are as given below.

(1) A deep ultraviolet light-emitting device comprising on a substrate in order: an n-type semiconductor layer, a light-emitting layer, a p-type electron block layer, and a p-type contact layer, wherein the p-type contact layer comprises a superlattice structure having an alternating stack of: a first layer made of $Al_xGa_{1-x}N$ having an Al composition ratio x higher than an Al composition ratio $w_0$ of a layer configured to emit deep ultraviolet light in the light-emitting layer; and a second layer made of $Al_yGa_{1-y}N$ having an Al composition ratio y lower than the Al composition ratio x, and the Al composition ratio $w_0$, the Al composition ratio x, the Al composition ratio y, and a thickness average Al composition ratio z of the p-type contact layer satisfy the following formulas [1] and [2]:

$$0.030 < z - w_0 < 0.20 \quad [1]$$

$$0.050 \leq x - y \leq 0.47 \quad [2].$$

(2) The deep ultraviolet light-emitting device of (1), wherein a terminal layer closer to the p-type electron block layer in a thickness direction of the p-type contact layer is the first layer.

(3) The deep ultraviolet light-emitting device of (1) or (2), wherein a terminal layer farther from the p-type electron blocking layer in a thickness direction of the p-type contact layer is the second layer.

(4) The deep ultraviolet light-emitting device of any one of (1) to (3), wherein the light-emitting layer has a quantum-well structure formed of an alternating stack of a well layer and a barrier layer.

(5) The deep ultraviolet light-emitting device of (4), further comprising a guide layer having an Al composition ratio higher than any of Al composition ratios of the barrier layer and the p-type electron block layer, the guide layer being disposed between the well layer closest to the p-type electron block layer in the light-emitting layer and the p-type electron block layer.

(6) The deep ultraviolet light-emitting device of (5), wherein the guide layer is made of AlN.

(7) The deep ultraviolet light-emitting device of any one of claims (1) to (6), wherein the Al composition ratio $w_0$ is 0.25 or more 0.60 or less.

(8) The deep ultraviolet light-emitting device of any one of (1) to (7), wherein the p-type contact layer has a high concentration area having a Mg concentration of $3 \times 10^{20}$ atoms/cm$^3$ or more on a surface side on which a p-side electrode is to be formed, the surface side facing away from the p-type electron block layer.

(9) The deep ultraviolet light-emitting device of any one of (1) to (8), wherein the p-type contact layer has a Si-doped area having a Si concentration of $5 \times 10^{16}$ atoms/cm$^3$ or more and $1 \times 10^{20}$ atoms/cm$^3$ or less on a surface side on which a p-side electrode is to be formed, the surface side facing away from the p-type electron block layer.

(10) A method of a manufacturing deep ultraviolet light-emitting device, comprising the steps of:

forming an n-type semiconductor layer on a substrate;

forming a light-emitting layer on the n-type semiconductor layer;

forming a p-type electron block layer on the light-emitting layer; and forming a p-type contact layer on the p-type electron block layer, wherein in forming the p-type contact layer, a first step of forming a first layer made of having an Al composition ratio x higher than an Al composition ratio $w_0$ of a layer configured to emit deep ultraviolet light in the light-emitting layer, and a second step of forming a second layer made of $Al_yGa_{1-y}N$ having an Al composition ratio y lower than the Al composition ratio x are alternately repeated to form the p-type contact layer having a superlattice structure, and the Al composition ratio $w_0$, the Al composition ratio x, the Al composition ratio y, and a thickness average Al composition ratio z of the p-type contact layer satisfy the following formulas [1] and [2]:

$$0.030 < z - w_0 < 0.20 \quad [1]$$

$$0.050 \leq x - y \leq 0.47 \quad [2].$$

Advantageous Effect

According to the present disclosure, it is possible to provide a deep ultraviolet light-emitting device having both high power output and excellent reliability, and a method of manufacturing the same.

BRIEF DESCRIPTION OF THE DRAWINGS

In the accompanying drawings:

FIG. 2 is a process diagram based on a schematic cross-sectional view for explaining a method of manufacturing a group III nitride semiconductor light-emitting device 100 according to an embodiment of the present disclosure.

DETAILED DESCRIPTION

Figure 1:
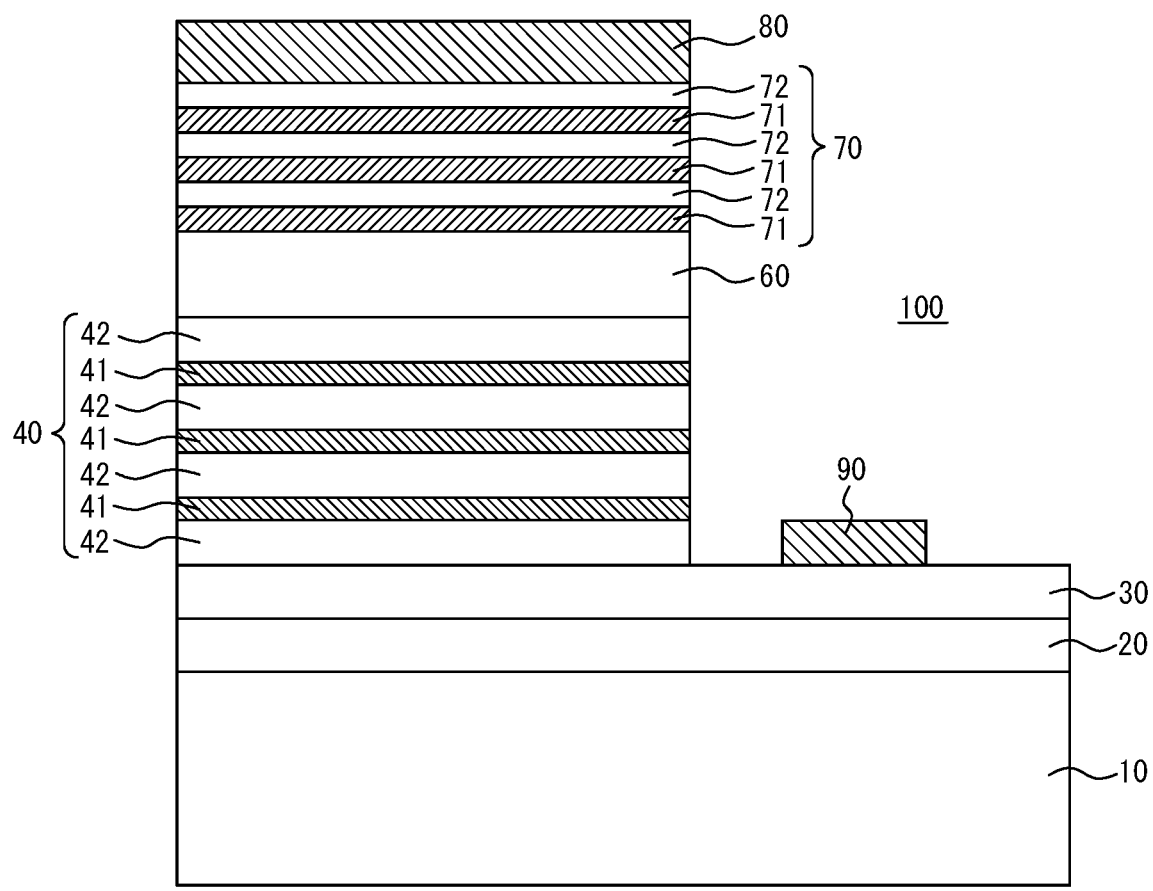
FIG. 1 is a schematic cross-sectional view for explaining a Group III nitride semiconductor light-emitting device 100 according to an embodiment of the present disclosure.

Before describing an embodiment according to the present disclosure, the following points will be described in advance. First, when "AlGaN" is simply denoted herein without explicitly identifying the Al composition ratio, it refers to any compound wherein the chemical composition ratio between Group III elements (total of Al and Ga) and N is 1:1 and wherein the ratio between the Group III elements is not defined. In this case, even when the Group III element In is not denoted, the compound may contain In in an amount of 5% or less with respect to the Group III elements Al and Ga. Further, when "AlN" or "GaN" is simply denoted herein, it means that Ga or Al is not included in the composition, respectively. However, when "AlGaN" is simply denoted herein, it is not intended to exclude that it refers to either AlN or GaN. The value of the Al composition ratio can be measured by photoluminescence measurement, X-ray diffraction measurement or other techniques.

Herein, a layer which electrically functions as p-type is referred to as a p-type layer, and a layer which electrically functions as n-type is referred to as an n-type layer. On the other hand, when specific impurities such as Mg and Si are not intentionally added and they do not function electrically as p-type nor n-type, they are referred to as "i-type" or "undoped". An undoped layer may contain impurities which are unavoidably added in the manufacturing process; specifically, a case where the carrier density is small (e.g., less than $4 \times 10^{16}/cm^3$) is referred to herein as "undoped". In addition, the values of impurity concentrations such as Mg and Si concentrations shall be based on SIMS spectrometry.

The entire thickness of each layer formed by epitaxial growth can be measured using an optical interferometric film thickness meter. Each thickness of each layer, when the compositions of the adjacent layers are sufficiently different (e.g., when the Al composition ratio is different by 0.01 or more), can be calculated by cross-sectional observation of the grown layer by transmission electron microscopy. The thickness of the boundary between the adjacent layers and the thickness of each layer shall be on measurements by TEM-EDS when they have the same Al composition ratio or almost the same Al composition ratio (e.g., the difference is less than 0.01) but having different impurity concentrations. The impurity concentrations can be measured by SIMS spectrometry. When the thickness of each layer is small as in the case of a superlattice structure, the thickness can be measured by TEM-EDS.

Hereinafter, an embodiment of the present disclosure will be described with reference to the drawings. In principle, the same components are given the same reference numbers and overlapping descriptions are not provided. In each drawing, for convenience of explanation, the aspect ratios of the substrate and the layers are exaggerated from their actual aspect ratios.

(Deep Ultraviolet Light-Emitting Device)

A deep ultraviolet light-emitting device 100 according to an embodiment of the present disclosure is a deep ultraviolet light-emitting device which sequentially includes, on a substrate 10, an n-type semiconductor layer 30, a light-emitting layer 40, a p-type electron block layer 60, and a p-type contact layer 70, as shown in FIG. 1. The p-type contact layer 70 has a superlattice structure formed of an alternating stack of: a first layer 71 made of $Al_xGa_{1-x}N$ having an Al composition ratio x higher than an Al composition ratio $w_0$ of a layer configured to emit deep ultraviolet light in the light-emitting layer 40; and a second layer 72 made of $Al_yGa_{1-y}N$ having an Al composition ratio y lower than the Al composition ratio x. The Al composition ratio $w_0$, the Al composition ratio x, the Al composition ratio y, and a thickness average Al composition ratio z of and p-type contact layer 70 satisfy the following formulas [1] and [2]:

$$0.030 < z - w_0 < 0.20 \quad [1]$$

$$0.050 \leq x - y \leq 0.47 \quad [2].$$

A preferred embodiment of the deep ultraviolet light-emitting device 100 is that, as shown in FIG. 1, a buffer layer 20 is provided between the substrate 10 and the n-type semiconductor layer 30, a p-side electrode 80 is provided directly above the p-type contact layer 70, and an n-side electrode 90 is provided on the exposed surface of the n-type semiconductor layer 30.

Hereinafter, for convenience of explanation, it is assumed that the Al composition and thickness of each of the first layer 71 and second layer 72 in the superlattice structure of the p-type contact layer 70 are constant. In this case, the thickness average Al composition ratio z of the p-type contact layer 70 is defined as follows: First, the number of the first layers 71 in the superlattice structure is denoted as N and the thickness of each first layer 71 is denoted as $t_a$. Similarly, the number of the second layers 72 is denoted as M and the thickness of each second layer 72 is denoted as $t_b$. At this time, the thickness average Al composition ratio z of the p-type contact layer 70 follows the following formula [3]:

$$z = \frac{N \cdot t_a \cdot x + M \cdot t_b \cdot y}{N \cdot t_a + M \cdot t_b} \quad [3]$$

The Al composition and thickness of each of the first layer 71 and the second layer 72 in the superlattice structure of the p-type contact layer 70 need not necessarily be constant. If there is a variation in the Al composition ratio and the thickness of each of the first layer 71 and the second layer 72 in the superlattice structure, the thickness average Al composition ratio z may be a weighted average value based on the thickness and Al composition ratio of each of the first layer 71 and the second layer 72, and the Al composition ratios x and y of the first layer 71 and the second layer 72, respectively, are intended to refer to a weighted average value by thickness.

Hereinafter, details of the configurations of the substrate 10, the n-type semiconductor layer 30, the light-emitting layer 40, the p-type electron block layer 60 and the p-type contact layer 70—the principle components of the deep ultraviolet light-emitting device 100 according to the present embodiment—will be described with reference to FIG. 1.

<Substrate>

As the substrate 10, it is preferred to use a substrate that allows emission light from the light-emitting layer 40 to pass through. For example, a sapphire substrate or a single-crystalline AlN substrate can be used. Alternatively, as the substrate 10, an AlN template substrate may be used which is obtained by epitaxially growing an undoped AlN layer on the surface of the sapphire substrate.

<N-Type Semiconductor Layer>

The n-type semiconductor layer 30 is provided on the substrate 10 with the buffer layer 20 interposed therebetween as required. The n-type semiconductor layer 30 may be provided directly on the substrate 10. The n-type semiconductor layer 30 is doped with an n-type dopant. Specific examples of n-type dopants include silicon (Si), germanium (Ge), tin (Sn), sulfur (S), oxygen (O), titanium (Ti), and zirconium (Zr). The dopant concentration by the n-type dopant is not specifically limited so long as the n-type semiconductor layer 30 can function as n-type. For example, the dopant concentration can be $1.0 \times 10^{18}$ atoms/cm$^3$ to $1.0 \times 10^{20}$ atoms/cm$^3$. It is preferred that the band gap of the n-type semiconductor layer 30 is wider than the band gap of the light-emitting layer 40 (well layer 41 where a quantum well structure is employed) and the n-type semiconductor layer 30 is transparent to deep ultraviolet light emitted. The n-type semiconductor layer 30 can have a single-layer structure and/or a multi-layer structure, as well as a composition gradient layer whose Group III element composition ratio is made gradient in the crystal growth direction, and a superlattice structure. The n-type semiconductor layer 30 not only forms a contact portion to the n-side electrode, also has a function of increasing the crystallinity from substrate to the light-emitting layer.

<Light-Emitting Layer>

The light-emitting layer 40 is provided on the n-type semiconductor layer 30 and is configured to emits deep ultraviolet light. The light-emitting layer 40 can be made of AlGaN and its Al-composition ratio can be set such that the emission light has the deep ultraviolet light wavelength of 200 nm to 350 nm or such that the central emission wavelength is 265 nm or more and 317 nm or less. Such an Al composition ratio can be, for example, in the range of 0.25 to 0.60.

The light-emitting layer 40 may be a single-layer structure having a constant Al composition ratio, and preferably has a multi-quantum well (MQW) structure in which the well layer 41 and barrier layer 42 made of AlGaN having different Al composition ratios are repeatedly formed. When the light-emitting layer 40 is a single-layer structure with a constant Al composition ratio, the Al composition ratio $w_0$ of the layer configured to deep ultraviolet light in the light-emitting layer 40 is the Al composition ratio the light-emitting layer 40 itself. When the light-emitting layer 40 has the multi-quantum well structure, since the well layer 41 corresponds to a layer configured to emit deep ultraviolet light in the light-emitting layer 40, for convenience, the Al composition ratio w of the well layer 41 is treated as corresponding to the Al composition ratio $w_0$. It is preferred that the Al composition ratio $w_0$ of the layer configured to emit deep ultraviolet light (or Al composition ratio w of the well layer) is set to 0.25 to 0.60 so that the emission light has the deep ultraviolet light wavelength of 200 nm to 350 nm or the central emission wavelength is 265 nm or more and 317 nm or less The Al composition ratio b of the barrier layer 42 is set higher than the Al composition ratio w of the well layer 41 (i.e., b>w). For the Al composition ratio b, under the condition of b>w, the Al composition ratio b of the barrier layer 42 can be, for example, set to 0.40 to 0.95. The number of repetitions of the well layer 41 and the barrier layer 42 is not particularly limited and can be 1 to 10, for example. It is preferred to configure the light-emitting layer 40 such that the top and bottom layers in the thickness direction of the light-emitting layer 40 (i.e., the first and last layers) are barrier layers. When the number of repetitions of the well layer 41 and the barrier layer 42 is "n", this case can be designated as "n. 5 sets of well layers and barrier layers". The thickness of the well layer 41 can be 0.5 nm to 5 nm and the thickness of the barrier layer 42 can be 3 nm to 30 nm.

<Guide Layer>

When the light-emitting layer 40 has the quantum well structure described above, it is preferred to provide, between the well layer 41 closest to the p-type electron block layer 60 in the light-emitting layer 40 and the p-type electron block layer 60 described later, a guide layer having an Al composition ratio higher than any of the Al composition ratios of the barrier layer 42 and the p-type electron block layer 60. This configuration makes it possible to increase the power output of the deep ultraviolet light-emitting device 100. In this case, when the Al composition ratio of the guide layer is denoted as $b_g$ and the Al composition ratio $\alpha$ of the p-type electron block layer 60 to be described later is used, the relationship between among the Al composition ratios is as follows:

$w$ (well layer)<$b$ (barrier layer)<$\alpha$ ($p$-type electron block layer)<$b_g$ (guide layer)

Further, it is also preferred to configure the light-emitting layer 40 as n pairs of the well layers 41 and the barrier layers 42 starting from the barrier layer 42, to provide the guide layer as a layer contacting both the light-emitting layer 40 and the p-type electron block layer 60, and make the guide layer thinner than the other barrier layers. For example, it is also preferred that the guide layer is made of AlN (this guide layer is particularly referred to as AlN guide layer) and the thickness of the guide layer is set to 0.7 nm to 1.7 nm.

<P-Type Electron Block Layer>

The p-type electron block layer 60 is provided on the light-emitting layer 40. The p-type electron block layer 60 is used as a layer for blocking electrons to allow the electrons to be injected into the light-emitting layer 40 (the well layer 41 in the case of MQW structure) to increase the electron injection efficiency. To that end, it is preferred to allow the Al composition ratio $\alpha$ of the p-type electron block layer 60 to satisfy the condition $0.35 \leq \alpha \leq 0.95$, although it depending on the Al composition ratio $w_0$ of the layer configured to emit deep ultraviolet light (corresponding to the Al composition ratio w of the well layer 41 in the case of quantum well structure). When the Al composition ratio $\alpha$ is 0.35 or more, the p-type electron block layer 60 may contain In in an amount which is 5% or less with respect to the Group III elements Al and Ga. It is preferred that the Al composition ratio $\alpha$ is set higher than the thickness average Al composition ratio z of the p-type contact layer 70 while satisfying the above condition. That is, it is preferred that $\alpha>z$. It is more preferred that the Al composition ratio $\alpha$ of the p-type electron block layer 60 and the Al composition ratio b of the barrier layer 42 satisfy the condition $0<\alpha-b\leq 0.55$. This makes it possible to reliably increase the injection efficiency of electrons into the well layer 41 by the p-type electron block layer 60.

The thickness of the p-type electron block layer 60 is not particularly limited, but preferably set to 10 nm to 80 nm, for example. When the thickness of the p-type electron block layer 60 falls within the range, it is possible to reliably obtain high power output. The thickness of the p-type electron block layer 60 is preferably larger than the thickness of the barrier layer 42. Examples of p-type dopants to be doped in the p-type electron block layer 60 include magnesium (Mg), zinc (Zn), calcium (Ca), beryllium (Be), and manganese (Mn); Mg is generally used. The dopant concentration in the p-type electron block layer 60 is not particularly limited so long as the p-type electron block layer 60 can function as a p-type layer. For example, the dopant concentration in the p-type electron block layer 60 can be $1.0\times10^{18}$ atoms/cm$^3$ to $5.0\times10^{21}$ atoms/cm$^3$.

<P-Type Contact Layer>

The p-type contact layer 70 is provided on the p-type electron block layer 60. The p-type contact layer 70 is a layer for reducing the contact resistance between the p-side electrode 80 provided directly above the p-type contact layer and the p-type electron block layer 60. Thus, there is no intended configuration except for impurities unavoidably included during the manufacturing process, between the p-type contact layer 70 and the p-side electrode 80. That is, the p-side electrode 80 is present on the p-type contact layer 70 of the superlattice structure.

As described above, the p-type contact layer 70 has a superlattice structure formed of an alternating stack of the first layer 71 made of $Al_xGa_{1-x}N$ and the second layer 72 made of $Al_yGa_{1-y}N$. The Al composition ratio x of the first layer 71 is set higher than the Al composition ratio $w_0$ of the layer configured to emit deep ultraviolet light in the light-emitting layer 40 (i.e., $x>w_0$) so as to increase transmittance for deep ultraviolet light. When the light-emitting layer 40 is a single-layer structure, the Al composition ratio x is set higher than the Al composition ratio of the light-emitting layer 40. When the light-emitting layer 40 has a quantum well structure, the Al composition ratio x is set higher than the Al composition ratio w of the well layer 41.

As described above, the Al composition ratio $w_0$, the Al composition ratio x, the Al composition ratio y, and the thickness average Al composition ratio z of the p-type contact layer satisfy the following formulas [1] and [2]:

$$0.030<z-w_0<0.20 \quad [1]$$

$$0.050\leq x-y\leq 0.47 \quad [2]$$

The following describes the technical significance of satisfying the formulas [1] and [2] in the p-type contact layer 70.

First, in the prior art, as a p-type contact layer of a deep ultraviolet light-emitting device, it was common to use a p-type GaN layer which can easily increase the hole concentration. However, the p-type GaN layer, due to its band gap, undesirably absorbs light of wavelength 360 nm or less. Therefore, out of the deep ultraviolet light emitted from light-emitting layer, an out-coupling effect from the side of the p-type contact layer or an out-coupling effect due to the reflection at the p-side electrode can hardly be expected. On the other hand, the p-type contact layer, if AlGaN with increased Al composition ratio is used for the p-type contact layer, although the hole concentration can be reduced to some extent as compared with GaN, the deep ultraviolet light emitted from the light-emitting layer can pass through the p-type contact layer, so that the out-coupling efficiency as a whole deep ultraviolet light-emitting device is increased and thus the power output of the deep ultraviolet light-emitting device can be increased as a result. However, the experiments conducted by the inventors revealed that if the Al-composition ratio of the p-type contact layer becomes too high, a deep ultraviolet light-emitting device with insufficient reliability is produced. On the other hand, the p-type contact layer 70 with a superlattice structure according to the present embodiment allows deep ultraviolet light to pass therethrough and thereby provides high power output because the thickness average Al composition ratio z is higher than the Al composition ratio $w_0$ of the layer configured to emit deep ultraviolet light in the light-emitting layer 40 (i.e., $z > w_0$). In addition, it was experimentally confirmed that there is no problem in reliability even if an overload reliability test was performed.

Without wishing to be bound by theory, it is believed that such a result can be obtained because the p-type contact layer 70 has a superlattice structure, so that a contact with the p-side electrode 80 can be established with a lower Al composition ratio while maintaining high transmittance and a thinner layer having a good crystallinity and also a low Al composition ratio can be formed. When a p-type contact layer having no superlattice structure is formed, if the Al composition ratio of the p-type contact layer is high, sudden death or the like occurs, which is insufficient from the viewpoint of reliability. Further, if the Al composition ratio of the p-type contact layer is low, deep ultraviolet light absorption is large, and the thickness of the p-type contact layer must be reduced. However, the film quality decreases due to the large lattice strain with the layer immediately below and hence the occurrence of sudden death inevitably increases. In the p-type contact layer 70 having a superlattice structure according to the present embodiment, layers having different Al composition ratios are alternately stacked atop each other and layers with a low Al composition ratio are stacked thinner than in a single-layer structure while realizing contact with an electrode at a low Al composition ratio, so that it is presumed that surface roughness and defect introduction due to lattice distortion can be suppressed.

In order to allow deep ultraviolet light to more reliably pass through the p-type contact layer 70, as defined in the above formula [1], the difference between the thickness average Al composition ratio z and the Al composition ratio w of the layer configured to emit deep ultraviolet light is set higher than 0.030 (i.e., $z - w_0 > 0.030$). For this purpose, it is preferred that the difference between the Al composition ratio z and the Al composition ratio w is higher than 0.040 ($z - w_0 > 0.040$), more preferably higher than 0.050 ($z - w_0 > 0.050$), and even more preferably higher than 0.06 ($z - w_0 > 0.060$).

In order to ensure reliability by establishing a good ohmic contact between the p-type contact layer 70 and the p-side electrode 80, it is required to set an upper limit of the thickness average Al composition ratio. Thus, as defined in the above formula [1], the upper limit of the difference between the thickness average Al composition ratio z and the Al composition ratio w of the layer configured to emit deep ultraviolet light is set to 0.20 ($z - w_0 < 0.20$); for this purpose, the upper limit of the difference between the Al composition ratio z and the Al composition ratio w is preferably set to 0.19 ($z - w_0 < 0.19$), and more preferably set to 0.18 ($z - w_0 < 0.18$).

As defined in the above formula [2], the difference between the Al composition ratio x of the first layer 71 and the Al composition ratio y of second layer 72 is 0.050 or more in absolute value ($x - y \leq 0.050$). This is to allow the p-type contact layer 70 to effectively function as a superlattice structure. Further, in order to reduce the strain of the entire superlattice structure and to establish a contact with the p-side electrode 80 at a low Al composition ratio, the difference between the Al composition ratio x of the first layer 71 and the Al composition ratio y of the second layer 72 is preferably set to 0.1 or more in absolute value ($x - y \leq 0.10$), and more preferably 0.15 or more in absolute value ($x - y \leq 0.15$). On the other hand, when the difference between the Al composition ratio x and the Al composition ratio y is excessive, the strain is increased because the lattice constant between the first and second layers changes greatly and it is difficult to obtain a good superlattice layer crystalline. Therefore, in order to obtain the effect of the present disclosure, it is preferred that the condition $x - y \leq 0.47$ is satisfied, more preferably the condition the $x - y \leq 0.45$ is satisfied.

The Al composition ratio y of the second layer 72—a layer with a low Al composition ratio in the superlattice structure—is advantageously set to 0.20 or more because it is possible to more reliably enhance transmittance of deep ultraviolet light from the light-emitting layer 40. For this purpose, it is more preferred that the Al composition ratio y is set to 0.21 or more, and more preferably 0.25 or more. On the other hand, the Al composition ratio y is advantageously set to 0.55 or less because it is possible to more reliably maintain high reliability. For this purpose, it is further preferred that the Al composition ratio y is set to 0.51 or less. As long as the thickness average Al composition ratio z is higher than the Al composition ratio $w_0$ of the layer configured to deep ultraviolet light in the light-emitting layer 40, the Al composition ratio y may be higher or lower than the Al composition ratio $w_0$. The Al composition ratio x may be appropriately set as long as the formulas [1] and [2] are satisfied; there are no limitations on the upper and lower limits of the Al composition ratio x. The Al composition ratio x may be generally set within the range of 0.40 to 0.80 while satisfying the formulas [1] and [2].

The thickness $t_a$ of the first layer 71 and the thickness $t_b$ of the second layer 72 are not particularly limited as long as the superlattice structure is formed and the condition of the thickness average Al composition z for the Al composition ratio of the light-emitting layer 40 is satisfied. For example, the thickness $t_a$ of the first layer 71 can be 1.0 nm or more 10.0 nm or less, and the thickness $t_b$ of the second layer 72 can be 1.0 nm or more 10.0 nm or less. The magnitude relation between thicknesses $t_a$ and $t_b$ is not limited; either may be larger than the other or both may be the same. It is preferred that the number of repetitions of the first layer 71 and the second layer 72 is appropriately set within the range of 3 to 15 so that the p-type contact layer 70 has an overall thickness of 20 nm or more and 100 nm or less, preferably 70 nm or less.

It is preferred that the terminal layer closer to the p-type electron block layer 60 in the thickness direction of the p-type contact layer 70 is the first layer 71. In other words, when there are no other intervening layers between the p-type contact layer 70 and the p-type electron block layer 60 and hence they are in contact with each other, it is preferred that the first layer 71 is provided immediately above the p-type electron block layer 60. Because the Al composition ratio x of the first layer 71 is higher than the Al composition ratio y of the second layer 72 and the Al composition ratio x is closer to the Al composition ratio α of the p-type electron block layer 60, it is possible to more reliably prevent the generation of defects due to the strain between the p-type electron block layer 60 and the p-type contact layer 70.

On the other hand, it is preferred that the terminal layer farther from the p-type electron block layer 60 in the thickness direction of the p-type contact layer 70 is the second layer 72. In other words, it is preferred that the layer in contact with the p-side electrode 80 is the second layer 72. In this case, the layer in contact with the p-side electrode 80 in the p-type contact layer 70 is the second layer 72. Because the Al composition ratio y of the second layer 72 is lower than the Al composition ratio x of the first layer 71, it is possible to more reliably establish an ohmic contact with the p-side electrode 80.

When the terminal layer closer to the p-type electron block layer 60 in the thickness direction of the p-type contact layer 70 is the first layer 71 and the terminal layer farther from the p-type electron block layer 60 in the thickness direction of the p-type contact layer 70 is the second layer 72, the number of the first layers 71 equals to the number of the second layers 72. However, in the present embodiment, the numbers of the two layers do not necessarily have to be the same. The present embodiment encompasses a case where the opposing terminal layers in the thickness direction of the p-type contact layer 70 are both the first layers 71 (in this case, the first layer 71 has one more layer than the second layer 72), and a case where the opposing terminal layers are both the second layers 72 (in this case, the second layer 72 has one more layer than the first layer 71).

As an embodiment in accordance with the present disclosure, a superlattice structure in which two different layers of the first layer 71 and the second layer 72 are repeatedly stacked atop each other has been described so far. However, as another embodiment in accordance with the present disclosure, a superlattice structure having a three-layer structure in which a third layer having an Al compositional ratio between those of the first and second layers is disposed between the first and second layers can be applied with the foregoing relationship between the first and second layers being the same. The same effect as that described above can be obtained also in this case.

As shown in FIG. 1, it is also preferred that the p-type contact layer 70 has, on a side facing away from the p-type electron block layer 60 (in other words, on a side contacting the p-side electrode 80), a high concentration area having a Mg concentration of $3 \times 10^{20}$ atoms/cm$^3$ or more, more preferably a Mg concentration of $5 \times 10^{20}$ or more. This increases the hole concentration of the p-type contact layer 70 to reduce the forward voltage Vf of the deep ultraviolet light-emitting device 100. Although it is not intended to limit the upper limit, considering industrial productivity, in the present embodiment, it is possible to set the upper limit of the Mg concentration in the high concentration area to $1 \times 10^{21}$ atoms/cm$^3$. In this case, the Mg concentration of the p-type contact layer 70 on the p-type electron block layer 60 side can be in a common range, which is typically $5 \times 10^{19}$ atoms/cm$^3$ or more and less than $3 \times 10^{20}$ atoms/cm$^3$. The Mg concentrations in the p-type contact layer is an average concentration in the respective regions as measured by SIMS. To maintain the crystallinity of the p-type contact layer 70, the thickness of the high-concentration region is usually 15 nm or less; several layers on the contacting the p-side electrode 80 can be a high-concentration region.

It is also preferred that the p-type contact layer 70 has, on a side facing away from the p-type electron block layer 60 (in other words, on a side contacting the p-side electrode 80), a Si-doped area having a Si concentration of $5 \times 10^{16}$ atoms/cm$^3$ or more and $1 \times 10^{20}$ atoms/cm$^3$ or less. It is more preferred that the Si-doped area has a Si concentration of $2 \times 10^{19}$ atoms/cm$^3$ or more and $5 \times 10^{19}$ atoms/cm$^3$ or less.

With this configuration, it is possible to further increase the power output of the deep ultraviolet light-emitting device 100. When the Si-doped area has a thickness of about 1 nm to about 5 nm, it is possible to reliably obtain this effect. The Si-doped area is preferably the last second layer in the superlattice structure of the p-type contact layer. The high concentration area described above having a Mg concentration of $3 \times 10^{20}$ atoms/cm$^3$ or more can be a co-doped area which is further doped with Si. The Si-doped area may be doped only with Si (i.e., Mg may not be doped).

When a Si-doped area doped only with Si is provided on the p-side electrode 80 side of the p-type contact layer 70 without Mg doping, such an area can also be considered n-type as a conductive type. However, in the case of the thickness range described above (1 nm to 5 nm), even if Mg is not doped, the area does not become a thyristor if it contacts the p-type electrode as the top layer of the p-type contact layer 70. Therefore, even in such a case, the Si-doped area is regarded as part of the p-type contact layer 70.

The deep ultraviolet light-emitting device 100 according to the present embodiment described above can achieve both high power output and excellent reliability.

Described below are specific aspects applicable to the present embodiment. The present embodiment is not limited to the specific aspects described below.

<Buffer Layer>

As shown in FIG. 1, it is also preferred to provide the buffer layer 20 between the substrate 10 and the n-type semiconductor layer 30 to mitigate lattice mismatch between them. The buffer layer 20 can be an undoped Group III nitride semiconductor layer. It is also preferred that the buffer layer 20 has a superlattice structure.

<P-Side Electrode>

The p-side electrode 80 may be provided directly above the p-type contact layer 70. For the p-side electrode 80, it is preferred to use metals having high reflectivity (e.g., 60% or more) with respect to ultraviolet light emitted from the light-emitting layer 40. Metals having such reflectivity can include, for example, rhodium (Rh), platinum (Pt), iridium (Ir), ruthenium (Ru), molybdenum (Mo), tungsten (W), tantalum (Ta), and alloys containing at least any of the foregoing. These metals or alloys are preferred because they have high reflectivity to deep ultraviolet light and, also, establish a relatively good ohmic contact between the p-type contact layer 70 and the p-side electrode 80. In terms of reflectivity, it is preferred that the p-side electrode 80 includes rhodium (Rh) in the form of an elemental metal or alloy. The thickness, shape and size of the p-side electrode 80 can be appropriately selected depending on the shape and size of the deep ultraviolet light-emitting device 100; for example, the thickness of the p-side electrode 80 can be 30 nm to 45 nm.

<N-Side Electrode>

The n-side electrode 90 which may be provided on the exposed surface of the n-type semiconductor layer 30 can be, for example, a metal composite film having a Ti-containing film and an Al-containing film formed on the Ti-containing film. The thickness, shape and size of the n-side electrode 90 can be appropriately selected depending on the shape and size of the light-emitting device. The n-side electrode 90 does not necessarily have to be formed on the exposed surface of the n-type semiconductor layer 30 in the manner as shown in FIG. 1. It is only necessary that the n-side electrode 90 is electrically connected to the n-type semiconductor layer.

<Other Configurations>

Although not shown in FIG. 1, a guide layer made of AlGaN having an Al composition ratio higher than the Al composition ratio α of the p-type electron block layer 60 may be provided between the light-emitting layer 40 and the p-type electron block layer 60. Providing such a guide layer can facilitate the injection of holes into the light-emitting layer 40.

<P-Type Cladding Layer>

Although not shown in FIG. 1, a p-type cladding layer made of AlGaN may be provided between the p-type electron block layer 60 and the p-type contact layer 70. The p-type cladding layer refers to a layer having an Al composition ratio which is higher than the Al composition ratio of the layer configured to emit deep ultraviolet light in the light emitting layer 40 (Al composition ratio w in the case of quantum well structure) and the thickness average Al composition ratio z of the p-type contact layer 70, but lower than the Al composition ratio α of the p-type electron block layer 60. That is, the p-type electron block layer 60 and the p-type cladding layer are both layers having an Al composition ratio higher than the Al composition ratio of the layer configured to emit deep ultraviolet light and also substantially allowing deep ultraviolet light emitted from the light-emitting layer 40 to pass therethrough. However, it is preferred that such a p-type cladding layer is not provided. The reason for this is as described in JP2016-111370A, the entire disclosure content is incorporated herein by reference. When a p-type cladding layer is provided and its Al composition ratio is defined as β, α>β and β>γ hold.

The deep ultraviolet light-emitting device 100 according to the present embodiment can be configured such that light is mainly out-coupled from the substrate side, or in the direction that is horizontal to the substrate by forming the p-side electrode 80 using reflection electrode materials to reflect deep ultraviolet light. The deep ultraviolet light-emitting device 100 can be of the so-called flip-chip type.

(Method of Manufacturing Deep Ultraviolet Light-Emitting Device)

Next, an embodiment of a method of manufacturing the deep ultraviolet light-emitting device 100 described above will be described with reference to FIG. 2. An embodiment of the method of manufacturing the deep ultraviolet light-emitting device 100 in accordance with the present disclosure includes the steps of: forming the n-type semiconductor layer 30 on the substrate 10 (see Step A); forming the light-emitting layer 40 on the n-type semiconductor layer 30; forming the p-type electron block layer 60 on the light-emitting layer 40 (see Step B); and forming the p-type contact layer 70 on the p-type electron block layer (see Step C). In the step of forming the p-type contact layer 70 (see Step C), a first step of forming the first layer 71 made of $Al_xGa_{1-x}N$ having an Al composition ratio x higher than an Al composition ratio $w_0$ of a layer configured to emit deep ultraviolet light in the light-emitting layer 40, and a second step of forming the second layer 72 made of $Al_yGa_{1-y}N$ having an Al composition ratio y lower than the Al composition ratio x are alternately repeated to form the p-type contact layer 70 having a superlattice structure. The Al composition ratio $w_0$, the Al composition ratio x, the Al composition ratio y, and the thickness average Al composition ratio z of the p-type contact layers 70 satisfy the following formulas [1] and [2]:

$$0.030 < z - w_0 < 0.20 \quad [1]$$

$$0.050 \leq x - y \leq 0.47 \quad [2]$$

Hereinafter, with reference to FIG. 2 which shows a flowchart according to a preferred embodiment of the present embodiment, each step will be described in detail together with its specific aspects. It should be noted that descriptions which are identical to those of the embodiment described above are not provided.

First, as shown in Steps A and B in FIG. 2, the n-type semiconductor layer 30, the light-emitting layer 40 and the p-type electron block layer 60 are sequentially formed on the substrate 10. In these steps, the layers can be formed by metal organic chemical vapor deposition (MOCVD), molecular beam epitaxy (MBE), sputtering or other known epitaxial growth techniques.

The growth temperature, the growth pressure and the growth time for epitaxial growth when forming the n-type semiconductor layer 30, the light-emitting layer 40, the guide layer and the p-type electron block layer 60 can be those commonly used in accordance with the Al composition and thickness of each layer. Carrier gas for epitaxial growth may be fed into the chamber using a hydrogen gas, a nitrogen gas, or a mixture gas of hydrogen and nitrogen. Source gases for growing these layers include trimethyl aluminum (TMA) and trimethyl gallium (TMG) as source gases of Group III elements; and $NH_3$ gas as a Group V element gas. Also, the molar ratio of the Group V element to the Group III element as calculated based on the growth gas flow rates of a Group V element gas such as $NH_3$ gas and a Group III element gas such as TMA gas (hereinafter referred to as "V/III ratio") can be a value commonly used in the art. As to gases for dopant sources, cyclopentadienyl-magnesium ($CP_2Mg$) gas or the like as a Mg source for p-type dopants, and as for n-type dopants, for example, a monosilane gas ($SiH_4$) as a Si source and a zinc chloride gas ($ZnCl_2$) as a Zn source may be appropriately selected and fed into the chamber at predetermined flow rates.

Next, in the p-type contact layer forming step shown in step C of FIG. 2, the p-type contact layer 70 having a superlattice structure in which the aforementioned first layer 71 and the second layer 72 are repeated is formed on the p-type electron block layer 60. The conditions for the thickness range and the Al composition ratio of the p-type contact layer 70 are as described above. The p-type contact layer 70 may also be grown by epitaxial growth using MOCVD or other techniques.

In order that a high-concentration area contacting the p-side electrode 80 has a Mg concentration of $3 \times 10^{20}$ atoms/$cm^3$ or more in the p-type contact layer 70, it is only necessary to perform processing as described below. That is, in the p-type contact layer forming step, the aforementioned superlattice structure is subjected to crystal growth by feeding a Group III source gas, a Group V source gas, and a Mg source gas, and immediately after the completion of crystal growth, the flow rate of the Group III source gas is lowered to ¼ or less of the flow rate during crystal growth while continuously feeding the Group V source gas and the Mg source gas for 1 minute or more 20 minutes or less.

In order to dope the p-type contact layer 70 with both Mg and Si on the side to be in contact with the p-side electrode 80, it is only necessary to feed $CP_2Mg$ gas into the chamber as an Mg source and also allow a monosilane ($SiH_4$) gas or the like as a Si source. When the p-type contact layer 70 is doped only with Si, it is only necessary to stop feeding $CP_2Mg$ gas as a Mg source into the chamber and allow a monosilane gas ($SiH_4$) to flow as a Si source. When the p-type contact layer 70 is to be doped with Si on the side to be in contact with the p-side electrode 80 as described above, the formation of the high-concentration area of Mg is optional.

As shown in Step D of FIG. 2, after forming the p-type contact layer 70, it is possible to form the p-side electrode 80 directly above the p-type contact layer 70. Further, portions of the light-emitting layer 40, p-type electron block layer 60 and p-type contact layer 70 can be removed by etching or other techniques to form the n-side electrode 90 on the exposed n-type semiconductor layer 30. The p-side electrode 80 and the n-side electrode 90 can be deposited by sputtering, vacuum deposition or other techniques. It is also preferred to form the buffer layer 20 on a surface of the substrate 10.

EXAMPLES

The disclosure will be described in more detail based on Examples below, which however shall not be construed as limiting the scope of the present disclosure.

Experimental Example 1

Inventive Example 1

According to the process diagram shown in FIG. 2, a deep ultraviolet light-emitting device according to Inventive Example 1 was fabricated. First, a sapphire substrate (2 inches in diameter, 430 µm in thickness, plane orientation: (0001)) was provided. By MOCVD, an AlN layer having a central film thickness of 0.60 µm was grown on the sapphire substrate to prepare an AlN template substrate. At that time, the growth temperature of the AlN layer was 1,300° C., the growth pressure in the chamber was 10 Torr, and the growth gas flow rates of ammonia gas and TMA gas were adjusted such that the V/III ratio become 163. As to the thickness of the AlN layer, a total of 25 positions dispersed at equal intervals, including the center of the wafer surface, were measured for thickness using an optical interferometric film thickness meter (Nanospec M6100A, manufactured by Nanometrix Inc.).

The AlN template substrate was then introduced into a heat treatment furnace. After establishing a nitrogen gas atmosphere in the furnace, the temperature inside the furnace was raised to subject the AlN template substrate to heat treatment. At that time, the heating temperature was set to 1,650° C. and the heating time was set to 4 hours.

Subsequently, a 1-µm-thick buffer layer made of undoped $Al_{0.70}Ga_{0.30}N$ was formed by MOCVD. A 2 µm-thick n-type semiconductor layer, made of $Al_{0.65}Ga_{0.35}N$ and doped with Si, was formed on the buffer layer. As a result of SIMS analysis, the Si concentration of the n-type semiconductor layer was $1.0 \times 10^{19}$ atoms/cm³.

A light-emitting layer was then formed on the n-type semiconductor layer. The light-emitting layer consists of a stack of 3.5 sets of alternating 3 nm-thick well layers made of $Al_{0.46}Ga_{0.54}N$ and 7 nm-thick barrier layers made of $Al_{0.64}Ga_{0.36}N$. "0.5" in "3.5 sets" indicates that the first and last layers of the light-emitting layer were barrier layers.

A 40 nm-thick p-type electron block layer made of $Al_{0.68}Ga_{0.32}N$ was then formed on the light-emitting layer using hydrogen gas as a carrier gas. When forming the p-type electron block layer, Mg was doped by feeding as an Mg source $CP_2Mg$ gas into the chamber. As a result of SIMS analyses, the Mg concentration of the p-type electron block layer was $5.0 \times 10^{18}$ atoms/cm³.

Subsequently, $Al_{0.60}Ga_{0.40}N$ was formed as a first layer directly above the p-type electron block layer and then $Al_{0.43}Ga_{0.57}N$ was formed as a second layer. 7 sets of formation of the first and second layers were repeated to form a p-type contact layer having a superlattice structure with a total of 14 layers. The thickness of the first layer was set to 5.0 nm and the thickness of the second layer to 2.5 nm so that the p-type contact layer has a total thickness of 52.5 nm. For forming the p-type contact layer, $CP_2Mg$ gas as a Mg source was fed into the chamber together with TMA gas and TMG gas (Group III source) and ammonia gas (Group V source) for crystal growth of a p-type contact layer doped with Mg. Thereafter, only feeding of the Group III source gases was stopped and only the Mg source gas and the Group V source gas were fed for 10.5 minutes to form a high concentration area on the surface side of the p-type contact layer.

The Al composition ratio of the p-type contact layer was determined from the emission wavelength (band gap energy) of the p-type contact layer as analyzed by photoluminescence measurement.

As a result of SIMS analysis, the Mg concentration of the p-type contact layer on the p-type electron block layer side was $1 \times 10^{20}$ atoms/cm³ and the Mg concentration of the p-type contact layer on the Mg-enriched side (high concentration area) facing away from the p-type electron block layer, where the p-type electrode 80 is to be formed, was $3 \times 10^{20}$ atoms/cm³.

Portions of the n-type semiconductor layer were then exposed by dry etching to form a cylindrical p-type semiconductor layer portion having a diameter of 280 µm. By pressing In balls having a diameter of 300 µm to the p-type semiconductor layer portion and the exposed portion of the n-type semiconductor layer and applying a current through the In balls, the power output of the deep ultraviolet light-emitting device according to Inventive Example 1 was evaluated. The layer structure of Inventive Example 1 is shown in Table 1.

TABLE 1

|  | Al composition ratio | Dopant | Thickness |
| --- | --- | --- | --- |
| P-type contact layer | 0.43 | Mg | 2.5 nm |
|  | 0.60 |  | 5.0 nm |
|  | 0.43 |  | 2.5 nm |
|  | 0.60 |  | 5.0 nm |
|  | 0.43 |  | 2.5 nm |
|  | 0.60 |  | 5.0 nm |
|  | 0.43 |  | 2.5 nm |
|  | 0.60 |  | 5.0 nm |
|  | 0.43 |  | 2.5 nm |
|  | 0.60 |  | 5.0 nm |
|  | 0.43 |  | 2.5 nm |
|  | 0.60 |  | 5.0 nm |
|  | 0.43 |  | 2.5 nm |
|  | 0.60 |  | 5.0 nm |
| P-type electron block layer | 0.68 | Mg | 40 nm |
| Light-emitting layer | 0.64 | — | 7 nm |
|  | 0.46 | — | 3 nm |
|  | 0.64 | Si | 7 nm |
|  | 0.46 | — | 3 nm |
|  | 0.64 | Si | 7 nm |
|  | 0.46 | — | 3 nm |
|  | 0.64 | Si | 7 nm |
| n-type semiconductor layer | 0.65 | Si | 2 µm |
| Undoped layer | 0.70 | — | 1 µm |
| AlN layer | 1 | — | 0.6 µm |
| Sapphire substrate | — | — | 430 µm |

Inventive Examples 2 to 13

Deep ultraviolet light-emitting devices according to Inventive Examples 2 to 13 were fabricated as in Inventive Example 1 except that the p-type contact layer with the superlattice structure in Inventive Example 1 was changed to the superlattice structure shown in Table 2, and their power output was evaluated. In Inventive Examples 2 and 3, in order to confirm the variation in power output, the superlattice structure of the p-type contact layer was the same as that in Inventive Example 1.

Conventional Example 1

A deep ultraviolet light-emitting device according to Conventional Example 1 was fabricated as in Inventive Example 1 except that the p-type contact layer with the superlattice structure in Inventive Example 1 was changed to a single-layer structure of a p-type GaN layer and that the thickness thereof was set to 50 nm, and its power output was evaluated.

Comparative Examples 1 to 4

Deep ultraviolet light-emitting devices according to Comparative Examples 1 to 4 were fabricated as in Inventive Example 1 except that the p-type contact layer with the superlattice structure in Inventive Example 1 was changed to an AlGaN layer with the single-layer structure shown in Table 2 and that the Al composition ratio and the thickness thereof were as shown in Table 2, and their power output was evaluated.

Comparative Example 5

A deep ultraviolet light-emitting device according to Comparative Example 5 was fabricated as in Inventive Example 1 except that in place of the p-type contact layer with the superlattice structure in Inventive Example 1, on the p-type electron block layer, a single-layer structure of a p-type $Al_{0.60}Ga_{0.40}N$ layer having a thickness of 50 nm was formed and then a single-layer structure of a p-type $Al_{0.35}Ga_{0.65}N$ layer having a thickness of 10 nm was formed, and its power output was evaluated.

Comparative Examples 6 to 11

Deep ultraviolet light-emitting devices according to Comparative Examples 6 to 11 were fabricated as in Inventive Example 1 except that the p-type contact layer with the superlattice structure in Inventive Example 1 was changed to the superlattice structure shown in Table 2, and their power output was evaluated.

TABLE 2

| | P-type contact layer | | | | | | |
|---|---|---|---|---|---|---|---|
| | Single-layer structure | | Superlattice structure | | | | |
| | | | First layer | | Second layer | | |
| | Al composition ratio | Thickness [nm] | Al composition ratio x | Thickness [nm] | Al composition ratio y | Thickness [nm] | Set number |
| Conv. Ex. 1 | 0 | 50.0 | — | — | — | — | — |
| Comp. Ex. 1 | 0.43 | 50.0 | — | — | — | — | — |
| Comp. Ex. 2 | 0.51 | 50.0 | — | — | — | — | — |
| Comp. Ex. 3 | 0.60 | 50.0 | — | — | — | — | — |
| Comp. Ex. 4 | 0.71 | 50.0 | — | — | — | — | — |
| Comp. Ex. 5 | — | — | 0.60 | 50.0 | 0.35 | 10.0 | 1 |
| Comp. Ex. 6 | — | — | 0.51 | 5.0 | 0.43 | 2.5 | 7 |
| Inv. Ex. 1 | — | — | 0.60 | 5.0 | 0.43 | 2.5 | 7 |
| Inv. Ex. 2 | — | — | 0.60 | 5.0 | 0.43 | 2.5 | 7 |
| Inv. Ex. 3 | — | — | 0.60 | 5.0 | 0.43 | 2.5 | 7 |
| Inv. Ex. 4 | — | — | 0.60 | 5.0 | 0.39 | 2.5 | 7 |
| Inv. Ex. 5 | — | — | 0.60 | 5.0 | 0.51 | 2.5 | 7 |
| Inv. Ex. 6 | — | — | 0.56 | 5.0 | 0.43 | 2.5 | 7 |
| Inv. Ex. 7 | — | — | 0.65 | 5.0 | 0.35 | 2.5 | 7 |
| Comp. Ex. 7 | — | — | 0.71 | 5.0 | 0.21 | 2.5 | 7 |
| Inv. Ex. 8 | — | — | 0.71 | 5.0 | 0.27 | 2.5 | 7 |
| Inv. Ex. 9 | — | — | 0.71 | 5.0 | 0.31 | 2.5 | 7 |

TABLE 2-continued

| | | | | | | | |
|---|---|---|---|---|---|---|---|
| Inv. Ex. 10 | — | — | 0.71 | 5.0 | 0.35 | 2.5 | 7 |
| Inv. Ex. 11 | — | — | 0.71 | 5.0 | 0.43 | 2.5 | 7 |
| Inv. Ex. 12 | — | — | 0.71 | 5.0 | 0.51 | 2.5 | 7 |
| Comp. Ex. 8 | — | — | 0.71 | 5.0 | 0.60 | 2.5 | 7 |
| Inv. Ex. 13 | — | — | 0.76 | 5.0 | 0.39 | 2.5 | 7 |
| Comp. Ex. 9 | — | — | 0.76 | 5.0 | 0.56 | 2.5 | 7 |
| Comp. Ex. 10 | — | — | 0.76 | 5.0 | 0.47 | 2.5 | 7 |
| Comp. Ex. 11 | — | — | 0.81 | 5.0 | 0.43 | 2.5 | 7 |

| | P-type contact layer Superlattice structure | | | Evaluation results | |
|---|---|---|---|---|---|
| | Thickness average Al composition ratio z | Difference between thickness average Al composition ratio z and Al composition ratio w of well layer | Difference between Al composition ratios x and y | Overall thickness [nm] | Yield after current application | Ave. power output after 100 mA current application [mW] |
| Conv. Ex. 1 | — | — | — | 50.0 | 100% | 1.40 |
| Comp. Ex. 1 | — | — | — | 50.0 | 100% | 1.12 |
| Comp. Ex. 2 | — | — | — | 50.0 | 90% | 1.81 |
| Comp. Ex. 3 | — | — | — | 50.0 | 90% | 3.42 |
| Comp. Ex. 4 | — | — | — | 50.0 | 20% | 1.83 |
| Comp. Ex. 5 | 0.510 | 0.050 | 0.25 | 60.0 | 90% | 1.26 |
| Comp. Ex. 6 | 0.483 | 0.023 | 0.08 | 52.5 | 100% | 1.07 |
| Inv. Ex. 1 | 0.543 | 0.083 | 0.17 | 52.5 | 100% | 2.15 |
| Inv. Ex. 2 | 0.543 | 0.083 | 0.17 | 52.5 | 100% | 1.86 |
| Inv. Ex. 3 | 0.543 | 0.083 | 0.17 | 52.5 | 100% | 2.04 |
| Inv. Ex. 4 | 0.530 | 0.070 | 0.21 | 52.5 | 100% | 1.64 |
| Inv. Ex. 5 | 0.570 | 0.110 | 0.09 | 52.5 | 100% | 2.28 |
| Inv. Ex. 6 | 0.517 | 0.057 | 0.13 | 52.5 | 100% | 1.44 |
| Inv. Ex. 7 | 0.550 | 0.090 | 0.30 | 52.5 | 100% | 1.96 |
| Comp. Ex. 7 | 0.543 | 0.083 | 0.50 | 52.5 | 80% | 1.96 |
| Inv. Ex. 8 | 0.563 | 0.103 | 0.44 | 52.5 | 100% | 2.27 |
| Inv. Ex. 9 | 0.577 | 0.117 | 0.40 | 52.5 | 100% | 2.25 |
| Inv. Ex. 10 | 0.590 | 0.130 | 0.36 | 52.5 | 100% | 1.97 |
| Inv. Ex. 11 | 0.617 | 0.157 | 0.28 | 52.5 | 100% | 2.63 |
| Inv. Ex. 12 | 0.643 | 0.183 | 0.20 | 52.5 | 100% | 3.20 |
| Comp. Ex. 8 | 0.673 | 0.213 | 0.11 | 52.5 | 70% | 3.70 |
| Inv. Ex. 13 | 0.637 | 0.177 | 0.37 | 52.5 | 100% | 2.80 |
| Comp. Ex. 9 | 0.693 | 0.233 | 0.20 | 52.5 | 70% | 3.20 |

TABLE 2-continued

| | | | | | | |
|---|---|---|---|---|---|---|
| Comp. Ex. 10 | 0.663 | <u>0.203</u> | 0.29 | 52.5 | <u>90%</u> | 3.70 |
| Comp. Ex. 11 | 0.683 | <u>0.223</u> | 0.38 | 52.5 | <u>90%</u> | 3.47 |

Note 1:
Compative Example 5 is not directed to superlattice. For covenience, however, data is designiated corresponding to first layer and second layer Note 2:
FIGS. not satisfying the inventive conditions are underlined.

(Evaluation 1: Reliability Evaluation)

For Inventive Examples 1 to 13, Conventional Example 1 and Comparative Examples 1 to 11, an overload reliability test was performed on 10 points in the wafer wherein an initial power output was confirmed by applying a current of 10 mA through In balls, a current of 100 mA was applied for 3 seconds, and then a current of 10 mA was applied. In Inventive Examples 1 to 13, Conventional Example 1 and Comparative Examples 1 and 6, there was no change even after a current was applied at a current of 100 mA. However, in Comparative Examples 2 to 5 and 7 to 11, after applying a current of 100 mA, no lighting or a portion where the power output was less than half the initial power output was observed within the wafer (that is, occurrence of sudden death was observed). Table 2 shows as yields the ratios of such non-lighting and the case where the power output was not sharply reduced to less than half the initial power output. In measuring the power output, a photodetector arranged on the sapphire substrate surface side was used.

It is considered that the reason why such a yield deterioration occurred in Comparative Examples 2 to 5 and 7 to 11 was that contact failure occurred at the interface between the p-type contact layer and the p-side electrode. On the other hand, it is presumed that no contact failure occurred in Inventive Examples 1 to 13 because the p-type contact layer has a superlattice structure and thus it was possible to reliably form a contact by means of a layer having a lower Al composition ratio while suppressing deterioration in film quality. When the yield rate is sufficiently high in the overload reliability test, it can be said that the device has sufficient reliability even when the electrodes are formed to form an actual deep ultraviolet light-emitting device.

(Evaluation 2: Simple Evaluation of Power Output)

In addition, for Inventive Examples 1 to 13, Conventional Example 1 and Comparative Examples 1 to 11, the average value of the power output at portions where the above-mentioned non-lighting or the rapid decrease in the power output to less than half the initial power output did not occur was measured. Table 2 shows the results. The center emission wavelengths for Inventive Examples 1 to 13, Conventional Example 1 and Comparative Examples 1 to 11 as measured with an optical fiber spectrometer were all 280 nm. From this result, it was confirmed that Inventive Examples 1 to 13 had higher power output than Conventional Example 1 and Comparative Examples 1 and 6. In Comparative Examples 1 and 6, although there was no problem with the yield because of reduced occurrence of contact failure, the power output was lower than that in Conventional Example 1 due to great absorption of deep ultraviolet light.

The thickness of the first layer was 5.0 nm and the thickness of the second layer was 2.5 nm, so the thickness average Al composition ratio z of the p-type contact layer was calculated using the equation $[z=(2/3)x+(1/3)y]$. Table 2 also shows the thickness average Al composition ratio z, and the difference (x−y) in Al composition ratio between the first and second layers. From Table 2, it can be confirmed that all those which were Inventive Examples satisfy the above formulas [1] and [2]. In particular, it can also be confirmed that the power output was high when $z-w_0 \geq 0.060$.

From the above results, it was confirmed that by forming a p-type contact layer satisfying the inventive condition, it is possible to realize both high power output and high reliability.

Experimental Example 2

In Experimental Example 1, power output and reliability were simply evaluated by applying a current between In balls without actually forming electrodes. The following experiment was performed in order to more accurately evaluate the device characteristics of the deep ultraviolet light-emitting device.

Inventive Example 2A

The process was the same as in Inventive Example 2 of Experimental Example 1 until a mask was formed on the p-type contact layer and mesa etching was performed by dry etching to expose the n-type semiconductor layer. Next, a p-side electrode made of Ni/Au was formed on the p-type contact layer by sputtering, and an n-side electrode made of Ti/Al was formed on the exposed n-type semiconductor layer. In the p-side electrode, the thickness of Ni was 100 Å and the thickness of Au was 200 Å. In the n-side electrode, the thickness of Ti was 200 Å and the thickness of Al was 1,500 Å. Finally, contact annealing (RTA) was performed at 550° C. In this way, a deep ultraviolet light-emitting device according to Inventive Example 2 Å was fabricated.

Conventional Example 1A

A deep ultraviolet light-emitting device according to Conventional Example 1 Å was fabricated as in Inventive Example 2 Å except that the p-type contact layer in Inventive Example 2 Å was the same as in Conventional Example 1 in Experimental Example 1.

(Evaluation 3: Characterization of Deep Ultraviolet Light-Emitting Device)

The forward voltage Vf and the power output Po (by an integrating sphere) when a current of 20 mA was applied to the semiconductor light-emitting devices obtained from Inventive Example 2 Å and Conventional Example 1 Å using a constant current voltage power supply were measured. An average value of the measurements of three samples was obtained for each example. The center emission wavelengths in Inventive Example 2 Å and Conventional Example 1 Å as measured by an optical fiber spectrometer were bot the same as that in Experimental Example 1: 280 nm. Further, the ratio of the remaining power output after 500 hours of current application to the initial power output ([power output after 500 hours]/[initial power output]) was measured. Table 3 shows the results.

TABLE 3

| | P-type contact layer | Initial power output $P_O$ [mW] | Forward voltage Vf [V] | Ratio of remaining power output [%] |
|---|---|---|---|---|
| Inventive Example 2A | Superlattice structure | 7.9 | 7.3 | 84 |
| Conventional Example 1A | GaN | 4.0 | 6.5 | 84 |

Comparing the evaluation result of the power output in Experimental Example 1 with that of the power output in Experimental Example 2, it can be seen that the power output of the deep ultraviolet light-emitting device can be sufficiently evaluated even by the simple evaluation performed in Experimental Example 1. It was also confirmed that in Inventive Example 2A, the power output was almost doubled compared to Conventional Example 1 Å while retaining the comparable ratio of remaining power output.

Experimental Example 3

In addition, in order to confirm the effect of the thicknesses of the first layer and the second layer in the superlattice structure, the following experiments were carried out.

Inventive Examples 14 to 17

Deep ultraviolet light-emitting devices according to Inventive Examples 14 to 17 were fabricated as in Inventive Example 1 except that the p-type contact layer with the superlattice structure in Inventive Example 1 was changed to the superlattice structure shown in Table 4, and their power output after current application and yield after current application were measured as in Evaluations 1 and 2.

Comparative Example 12

A deep ultraviolet light-emitting device according to Comparative Example 12 was fabricated as in Inventive Example 1 except that the p-type contact layer with the superlattice structure in Inventive Example 1 was changed to the superlattice structure shown in Table 4, and their power output after current application and yield after current application were measured as in Evaluations 1 and 2.

In conjunction with Conventional Example 1 in Experimental Example 1, the fabrication conditions and evaluation results of Inventive Examples 14 to 17 and Comparative Example 12 are shown in Table 4.

TABLE 4

| | P-type contact layer | | | | | |
|---|---|---|---|---|---|---|
| | Single-layer structure | | Superlattice structure | | | |
| | | | First layer | | Second layer | |
| | Al composition ratio | Thickness [nm] | Al composition ratio x | Thickness [nm] | Al composition ratio y | Thickness [nm] | Set number |
| Conv. Ex. 1 | 0 | 50.0 | — | — | — | — | — |
| Comp. Ex. 12 | — | — | 0.60 | 2.50 | 0.43 | 5.00 | 7 |
| Inv. Ex. 14 | — | — | 0.60 | 6.50 | 0.43 | 1.00 | 7 |
| Inv. Ex. 15 | — | — | 0.60 | 5.00 | 0.54 | 2.75 | 7 |
| Inv. Ex. 16 | — | — | 0.60 | 5.00 | 0.49 | 3.00 | 7 |
| Inv. Ex. 17 | — | — | 0.60 | 3.00 | 0.49 | 5.00 | 7 |

| | P-type contact layer Superlattice structure | | | | Evaluation results | |
|---|---|---|---|---|---|---|
| | Thickness average Al composition ratio z | Difference between thickness average Al composition ratio z and Al composition ratio w of well layer | Difference between Al composition ratios x and y | Overall thickness [nm] | Yield after current application | Ave. power output after 100 mA current application [mW] |
| Conv. Ex. 1 | — | — | — | 50.00 | 100% | 1.40 |
| Comp. Ex. 12 | 0.487 | 0.027 | 0.17 | 52.50 | 100% | 1.13 |
| Inv. Ex. 14 | 0.577 | 0.117 | 0.17 | 52.50 | 100% | 2.58 |

TABLE 4-continued

| | | | | | | |
|---|---|---|---|---|---|---|
| Inv. Ex. 15 | 0.579 | 0.119 | 0.06 | 54.25 | 100% | 2.68 |
| Inv. Ex. 16 | 0.559 | 0.099 | 0.11 | 56.00 | 100% | 2.22 |
| Inv. Ex. 17 | 0.531 | 0.071 | 0.11 | 56.00 | 100% | 2.17 |

Note 3:
FIGS. not satisfying the inventive conditions are underlined.

From Table 4, it can be confirmed that there is almost no influence on the magnitude relationship between the thickness of the first layer and the thickness of the second layer; it is presumed that the effect of the difference between the thickness average Al composition ratio z and the Al composition ratio w of the well layer (corresponding to $z-w_0$) is large rather than the thickness magnitude relationship between the layers.

Experimental Example 4

In order to confirm the effect of the number of sets of the first and second layers in the superlattice structure, the following experiments were carried out.

Inventive Examples 18 to 22

Deep ultraviolet light-emitting devices according to Inventive Examples 18 to 22 were fabricated as in Inventive Example 1 except that the p-type contact layer with the superlattice structure in Inventive Example 1 was changed to the superlattice structure shown in Table 5, and their power output after current application and yield after current application were measured as in Evaluations 1 and 2.

In conjunction with Conventional Example 1 in Experimental Example 1, the preparation conditions and evaluation results of Inventive Examples 18 to 22 are shown in Table 5.

TABLE 5

| | P-type contact layer | | | | | |
|---|---|---|---|---|---|---|
| | Single-layer structure | | Superlattice structure | | | |
| | | | First layer | | Second layer | |
| | Al composition ratio | Thickness [nm] | Al composition ratio x | Thickness [nm] | Al composition ratio y | Thickness [nm] | Set number |
| Conv. Ex. 1 | 0 | 50.0 | — | — | — | — | — |
| Inv. Ex. 18 | — | — | 0.60 | 5.0 | 0.43 | 2.5 | 3 |
| Inv. Ex. 19 | — | — | 0.60 | 5.0 | 0.35 | 2.5 | 7 |
| Inv. Ex. 20 | — | — | 0.60 | 5.0 | 0.43 | 2.5 | 7 |
| Inv. Ex. 21 | — | — | 0.60 | 2.5 | 0.54 | 2.75 | 10 |
| Inv. Ex. 22 | — | — | 0.60 | 5.0 | 0.43 | 2.5 | 10 |

| | P-type contact layer Superlattice structure | | | | Evaluation results | |
|---|---|---|---|---|---|---|
| | Thickness average Al composition ratio z | Difference between thickness average Al composition ratio z and Al composition ratio w of well layer | Difference between Al composition ratios x and y | Overall thickness [nm] | Yield after current application | Ave. power output after 100 mA current application [mW] |
| Conv. Ex. 1 | — | — | — | 50.0 | 100% | 1.40 |
| Inv. Ex. 18 | 0.543 | 0.083 | 0.17 | 22.5 | 100% | 3.64 |
| Inv. Ex. 19 | 0.517 | 0.057 | 0.25 | 52.5 | 100% | 1.44 |

TABLE 5-continued

| | | | | | | |
|---|---|---|---|---|---|---|
| Inv. Ex. 20 | 0.543 | 0.083 | 0.17 | 52.5 | 100% | 2.58 |
| Inv. Ex. 21 | 0.520 | 0.060 | 0.06 | 52.5 | 100% | 2.68 |
| Inv. Ex. 22 | 0.543 | 0.083 | 0.17 | 75.0 | 100% | 0.98 |

From Table 5, it is considered that the effect on the reliability due to the number of sets of the first and second layers in the superlattice structure is small.

Experimental Example 5

Finally, experiments were also carried out on deep ultraviolet light-emitting devices with different center emission wavelengths.

Inventive Example 23

A deep ultraviolet light-emitting device according to Inventive Example 23 was fabricated as in Inventive Example 1 except that the well layer made of $Al_{0.46}Ga_{0.54}N$ (w=0.46) in Inventive Example 1 was changed to a well layer made of $Al_{0.29}Ga_{0.71}N$ (w=0.29), the first layer in the p-type contact layer to $Al_{0.43}Ga_{0.57}N$, and the second layer to $Al_{0.27}Ga_{0.73}N$, and their power output after current application and yield after current application were measured as in Evaluations 1 and 2. The center emission wavelength was 310 nm.

Inventive Examples 24 to 25

Deep ultraviolet light-emitting devices according to Inventive Examples 24 and 25 were fabricated as in Inventive Example 23 except that the p-type contact layer with the superlattice structure in Inventive Example 23 was changed to the superlattice structure shown in Table 6, and their power output after current application and yield after current application were measured as in Evaluations 1 and 2.

Conventional Example 2

A deep ultraviolet light-emitting device according to Conventional Example 2 was fabricated as in Inventive Example 23 except that the p-type contact layer with the superlattice structure in Inventive Example 23 was changed to a single-layer structure of a p-type GaN layer, and its power output after current application and yield after current application were measured as in Evaluations 1 and 2.

Comparative Examples 13 and 14

Deep ultraviolet light-emitting devices according to Comparative Examples 13 and 14 were fabricated as in Inventive Example 23 except that the p-type contact layer with the superlattice structure in Inventive Example 23 was changed to a single-layer structure of a p-type AlGaN layer with the single-layer structure shown in Table 6 and that their Al composition ratio and thickness were changed as shown in Table 6, and their power output was evaluated.

The results are shown in Table 6.

TABLE 6

| | P-type contact layer | | | | | | |
|---|---|---|---|---|---|---|---|
| | Single-layer structure | | Superlattice structure | | | | |
| | | | First layer | | Second layer | | |
| | Al composition ratio | Thickness [nm] | Al composition ratio x | Thickness [nm] | Al composition ratio y | Thickness [nm] | Set number | Thickness average Al composition ratio z |
| Conv. Ex. 2 | 0 | 50.0 | — | — | — | — | — | — |
| Comp. Ex. 13 | 0.23 | 52.5 | — | — | — | — | — | — |
| Comp. Ex. 14 | 0.41 | 52.5 | — | — | — | — | — | — |
| Inv. Ex. 23 | — | — | 0.43 | 5.0 | 0.27 | 2.5 | 7 | 0.377 |
| Inv. Ex. 24 | — | — | 0.47 | 5.0 | 0.31 | 2.5 | 7 | 0.417 |
| Inv. Ex. 25 | — | — | 0.39 | 5.0 | 0.21 | 2.5 | 3 | 0.330 |

TABLE 6-continued

| | P-type contact layer Superlattice structure | | | Evaluation results | | |
|---|---|---|---|---|---|---|
| | Difference between thickness average Al compostion ratio z and Al composition ratio w of well layer | Difference between Al composition ratios x and y | Overall thickness [nm] | Emission wavelength [nm] | Yield after current application | Ave. power output after 100 mA current application [mW] |
| Conv. Ex. 2 | — | — | 50.0 | 310 | 100% | 1.50 |
| Comp. Ex. 13 | — | — | 52.5 | 310 | <u>90%</u> | <u>1.37</u> |
| Comp. Ex. 14 | — | — | 52.5 | 310 | <u>80%</u> | 3.58 |
| Inv. Ex. 23 | 0.087 | 0.16 | 52.5 | 310 | 100% | 1.93 |
| Inv. Ex. 24 | 0.127 | 0.16 | 52.5 | 312 | 100% | 2.60 |
| Inv. Ex. 25 | 0.040 | 0.18 | 22.5 | 310 | 100% | 3.24 |

Note 4:
FIGS. not satisfying the inventive conditions are underlined.

From the results in Table 6, it was confirmed that when the p-type contact layer satisfies formulas [1] and [2] described above which are inventive conditions, it is possible to achieve both high power output and high reliability. In addition, regarding Conventional Example 2 and Inventive Examples 23 to 25, the device was mounted on a submount made of AlN and the power output after applying a current of 350 mA for 1,000 hours was measured to confirm the reliability based on the % reduction from the initial power output. 70% reduction is equivalent to at least 3,000 hours, and it was confirmed that it had a practical level of reliability.

Experimental Example 6

Inventive Example 26

The last barrier layer (Al composition ratio: 0.64, thickness: 7 nm) of the light-emitting layer in Inventive Example 10 was changed to an AlN guide layer (Al composition ratio: 1.0, thickness: 1 nm). In addition, the layer having a thickness of 2.5 nm and 35% Al composition in the p-type contact layer 70 on the side facing away from the p-type electron block layer 60 (in other words, the side in contact with the p-side electrode 80) (the last second layer in the superlattice structure) was doped with Si together with Mg as dopants (i.e., Mg and Si were co-doped). Doping of Si was performed by flowing a monosilane gas ($SiH_4$) as a Si source while feeding $CP_2Mg$ gas into the chamber as a Mg source. The other conditions were the same as those in Inventive Example 10 and a deep ultraviolet light-emitting device of Inventive Example 26 was fabricated. The specific layer structure of Inventive Example 26 is shown in Table 7. By SIMS analysis, the Mg concentration of the Mg high concentration area was $3 \times 10^{20}$ atoms/$cm^3$ as in the case of Inventive Example 10, and the Si concentration of the top layer of the p-type contact layer was $2 \times 10^{19}$ atoms/$cm^3$.

TABLE 7

| | Al composition ratio | Dopant | Thickness |
|---|---|---|---|
| P-type contact layer | 0.35 | Mg + Si | 2.5 nm |
| | 0.71 | Mg | 5.0 nm |
| | 0.35 | | 2.5 nm |
| | 0.71 | | 5.0 nm |
| | 0.35 | | 2.5 nm |
| | 0.71 | | 5.0 nm |
| | 0.35 | | 2.5 nm |
| | 0.71 | | 5.0 nm |
| | 0.35 | | 2.5 nm |
| | 0.71 | | 5.0 nm |
| | 0.35 | | 2.5 nm |
| | 0.71 | | 5.0 nm |
| | 0.35 | | 2.5 nm |
| | 0.71 | | 5.0 nm |
| P-type electron block layer | 0.68 | Mg | 40 nm |
| AlN guide layer | 1.0 | — | 1 nm |
| Light-emitting layer | 0.46 | — | 3 nm |
| | 0.64 | Si | 7 nm |
| | 0.46 | — | 3 nm |
| | 0.64 | Si | 7 nm |
| | 0.46 | — | 3 nm |
| | 0.64 | Si | 7 nm |
| N-type semiconductor layer | 0.65 | Si | 2 μm |
| Undoped layer | 0.70 | — | 1 μm |
| AlN layer | 1 | — | 0.6 μm |
| Sapphire substrate | — | — | 430 μm |

Inventive Example 27

A deep ultraviolet light-emitting device according to Inventive Example 27 was fabricated as in Inventive Example 26 except that the Si doping amount in the layer of the p-type contact layer 70 in Inventive Example 26 which faces away from the p-type electron block layer 60 (in other words, the layer on the side contacting the p-side electrode 80) was increased to $4 \times 10^{19}$ atoms/$cm^3$ while the Mg concentration was retained at $3 \times 10^{20}$ atoms/$cm^3$.

Inventive Example 28

The last barrier layer (Al composition ratio: 0.64, thickness: 7 nm) of the light-emitting layer in Inventive Example 10 was changed to an AlN guide layer (Al composition ratio: 1.0, thickness: 1 nm). The layer having a thickness of 2.5 nm and 35% Al composition in the p-type contact layer 70 on the side facing away from the p-type electron block layer 60 (in other words, the side in contact with the p-side electrode 80) (the last second layer in the superlattice structure) was doped only with Si without Mg so that a Mg high concentration area was not formed on the surface side of the p-type contact layer (the Mg concentration of the p-type contact layer on the p-type electron block layer side is the same as in Inventive Example 10, which is $1 \times 10^{20}$ atoms/cm$^3$). Doping of Si was performed by flowing a monosilane gas (SiH$_4$) as a Si source while stopping feeding of the CP$_2$Mg gas as a Mg source into the chamber. The other conditions were the same as those in Inventive Example 10 and a deep ultraviolet light-emitting device of Inventive Example 28 was fabricated. By SIMS analysis, the Si concentration of the top layer of the p-type contact layer was $2 \times 10^{19}$ atoms/cm$^3$.

Inventive Example 29

A deep ultraviolet light-emitting device according to Inventive Example 29 was fabricated as in Inventive Example 10 except that the last barrier layer (Al composition ratio: 0.64, thickness: 7 nm) of the light-emitting layer in Inventive Example 10 was changed to an AlN guide layer (Al composition ratio: 1.0, thickness: 1 nm).

For Inventive Examples 26 to 29, the power output after current application and yield after current application were evaluated as in Evaluations 1 and 2. The results are shown in Table 8. Table 8 again shows the results of Inventive Example 10 (without MN guide layer).

From the above results, the effectiveness of providing an MN guide layer and providing a Si-doped area in the top layer of the p-type contact layer was also confirmed.

INDUSTRIAL APPLICABILITY

According to the present disclosure, it is possible to provide a deep ultraviolet light-emitting device having both high power output and excellent reliability, and a method of manufacturing the same.

REFERENCE SIGNS LIST

10 substrate
20 buffer layer
30 n-type semiconductor layer
40 light-emitting layer
41 well layer
42 barrier layer
60 p-type electron block layer
70 p-type contact layer
71 first layer
72 second layer
80 p-side electrode
90 n-side electrode
100 deep ultraviolet light-emitting device

The invention claimed is:

1. A deep ultraviolet light-emitting device comprising on a substrate in order: an n-type semiconductor layer, a light-emitting layer, a p-type electron block layer, and a p-type contact layer, wherein
    the p-type contact layer comprises a superlattice structure having an alternating stack of: a first layer made of Al$_x$Ga$_{1-x}$N having an Al composition ratio x higher than an Al composition ratio w$_0$ of a layer configured to emit deep ultraviolet light in the light-emitting layer; and a

TABLE 8

| | P-type contact layer | | | | | | Evaluation results | | |
|---|---|---|---|---|---|---|---|---|---|
| | First layer | | Second layer | | | | Ave. power output | | Yield |
| | Al composition ratio x | Thickness | Al composition ratio y | Thickness | Top second layer | | after 100 mA current application | Ratio of sudden death | after current application |
| | | | | | Mg conc. [atoms/cm$^3$] | Si conc. [atoms/cm$^3$] | | | |
| Inv. Ex. 26 | 0.71 | 5 | 0.35 | 2.5 | $3.0 \times 10^{20}$ | $2.0 \times 10^{19}$ | 2.40 | 0% | 100% |
| Inv. Ex. 27 | 0.71 | 5 | 0.35 | 2.5 | $3.0 \times 10^{20}$ | $4.0 \times 10^{19}$ | 2.56 | 0% | 100% |
| Inv. Ex. 28 | 0.71 | 5 | 0.35 | 2.5 | Not doped | $2.0 \times 10^{19}$ | 2.51 | 0% | 100% |
| Inv. Ex. 29 | 0.71 | 5 | 0.35 | 2.5 | $3.0 \times 10^{20}$ | Not doped | 2.17 | 0% | 100% |
| Inv. Ex. 10 | 0.71 | 5 | 0.35 | 2.5 | $3.0 \times 10^{20}$ | Not doped | 1.97 | 0% | 100% | second layer made of $Al_yGa_{1-y}N$ having an Al composition ratio y lower than the Al composition ratio x, and the Al composition ratio $w_0$, the Al composition ratio x, the Al composition ratio y, and a thickness average Al composition ratio z of the p-type contact layer satisfy the following formulas [1] and [2]:

$$0.030 < z - w_0 < 0.20 \quad [1]$$

$$0.050 \leq x - y \leq 0.47 \quad [2].$$

2. The deep ultraviolet light-emitting device of claim 1, wherein a terminal layer closer to the p-type electron block layer in a thickness direction of the p-type contact layer is the first layer.

3. The deep ultraviolet light-emitting device of claim 1, wherein a terminal layer farther from the p-type electron blocking layer in a thickness direction of the p-type contact layer is the second layer.

4. The deep ultraviolet light-emitting device of claim 1, wherein the light-emitting layer has a quantum-well structure formed of an alternating stack of a well layer and a barrier layer.

5. The deep ultraviolet light-emitting device of claim 4, further comprising a guide layer having an Al composition ratio higher than any of Al composition ratios of the barrier layer and the p-type electron block layer, the guide layer being disposed between the well layer closest to the p-type electron block layer in the light-emitting layer and the p-type electron block layer.

6. The deep ultraviolet light-emitting device of claim 5, wherein the guide layer is made of AlN.

7. The deep ultraviolet light-emitting device of claim 1, wherein the Al composition ratio $w_0$ is 0.25 or more 0.60 or less.

8. The deep ultraviolet light-emitting device of claim 1, wherein the p-type contact layer has a high concentration area having a Mg concentration of $3 \times 10^{20}$ atoms/cm$^3$ or more on a surface side on which a p-side electrode is to be formed, the surface side facing away from the p-type electron block layer.

9. The deep ultraviolet light-emitting device of claim 1, wherein the p-type contact layer has a Si-doped area having a Si concentration of $5 \times 10^{16}$ atoms/cm$^3$ or more and $1 \times 10^{20}$ atoms/cm$^3$ or less on a surface side on which a p-side electrode is to be formed, the surface side facing away from the p-type electron block layer.

10. A method of manufacturing a deep ultraviolet light-emitting device, comprising the steps of:
   forming an n-type semiconductor layer on a substrate;
   forming a light-emitting layer on the n-type semiconductor layer;
   forming a p-type electron block layer on the light-emitting layer; and
   forming a p-type contact layer on the p-type electron block layer, wherein
   in forming the p-type contact layer, a first step of forming a first layer made of $Al_xGa_{1-x}N$ having an Al composition ratio x higher than an Al composition ratio $w_0$ of a layer configured to emit deep ultraviolet light in the light-emitting layer, and a second step of forming a second layer made of $Al_yGa_{1-y}N$ having an Al composition ratio y lower than the Al composition ratio x are alternately repeated to form the p-type contact layer having a superlattice structure, and
   the Al composition ratio $w_0$, the Al composition ratio x, the Al composition ratio y, and a thickness average Al composition ratio z of the p-type contact layer satisfy the following formulas [1] and [2]:

$$0.030 < z - w_0 < 0.20 \quad [1]$$

$$0.050 \leq x - y \leq 0.47 \quad [2].$$

* * * * *